United States Patent [19]

Kuo

[11] 4,009,404
[45] Feb. 22, 1977

[54] MONOSTABLE MULTIVIBRATOR HAVING MINIMAL RECOVERY TIME

[75] Inventor: James Ren-Jke Kuo, Cupertino, Calif.

[73] Assignee: Fairchild Camera and Instrument Corporation, Mountain View, Calif.

[22] Filed: Oct. 6, 1975

[21] Appl. No.: 619,752

[52] U.S. Cl. .............................. 307/273; 307/265; 307/315
[51] Int. Cl.² ........................................ H03K 3/10
[58] Field of Search ................. 307/265, 273, 315; 328/207

[56] References Cited

UNITED STATES PATENTS

| | | | |
|---|---|---|---|
| 2,976,432 | 3/1961 | Geckle, Jr. | 307/273 |
| 3,453,453 | 7/1969 | Hughes | 307/273 |
| 3,484,624 | 12/1969 | Rasiel et al. | 307/265 |
| 3,671,774 | 6/1972 | Millman | 307/273 |
| 3,742,257 | 6/1973 | Wittenzellner | 307/273 |
| 3,883,756 | 5/1975 | Dragon | 307/273 |

OTHER PUBLICATIONS

"Darlington Transistors Widen Multivibrator's Range" by Golden, Electronics, Nov. 25, 1968, p. 82.

*Primary Examiner*—Stanley D. Miller, Jr.
*Attorney, Agent, or Firm*—Alan H. MacPherson; Henry K. Woodward; Norman E. Reitz

[57] ABSTRACT

A monostable multivibrator has improved output control by minimizing the recovery time of a transistor pair and using a voltage comparator for comparing the recharging voltage of the timing network with a reference for output signal development. Recovery time is minimized by employing a Darlington circuit for accelerating discharge of the timing network in response to the trigger signal to the monostable transistor pair, whereby the voltage comparator generates an output signal which is a function primarily of recharging time of the timing network.

6 Claims, 6 Drawing Figures and appended claims when taken with the drawings.

MONOSTABLE MULTIVIBRATOR HAVING MINIMAL RECOVERY TIME

BACKGROUND OF THE INVENTION

This invention relates to monostable multivibrators and, more particularly, to a retriggerable monostable multivibrator having minimal recovery time.

Monostable multivibrators are well known in the pulse and switching waveform art. They are commonly used as gating or delay circuits, as described in Millman & Taub, "Pulse, Digital and Switching Waveforms," pp. 404–451, McGraw-Hill, 1965. In operation, upon the application of a triggering signal, the circuit switches from its stable state to its quasistable state and remains in the quasistable state while a timing impedance, typically consisting of a timing capacitor $C_X$ and timing resistor $R_X$, is discharged; the circuit will then return to the stable state within a variable period known as the recovery time. The pulse width of the output is the sum of the discharge time of the timing impedance and the recovery or recharge time. The value of the recovery time can be varied by varying $C_X$ and $R_X$ over a wide range to obtain a desired pulse width. It is desirable, generally, then, that the discharge time of the timing impedance be short as compared with the recovery time so that the pulse width can be accurately set over a wide range by varying the values of $C_X$ and $R_X$ without the limitation of a relatively large fixed discharge time.

SUMMARY OF THE INVENTION

The monostable multivibrator in accordance with the present invention includes means for accelerating the discharge of the timing network whereby the output signal is, effectively, determined by the charge time of the timing network, which is determined by the resistor-capacitor values of the network. Thus, variations in discharge time of the network, caused by process variations, are minimized.

A pair of transistors are interconnected whereby one transistor is conductive when the other transistor is nonconductive and wherein said transistors have a stable state and an unstable state. Resistive-capacitive means are interconnected with said pair of transistors for establishing the time period of the unstable state.

Trigger means is provided for triggering the transistor pair to the unstable state and discharging the resistive-capacitive timing means. The transistor pair reverts to the stable state when the timing network discharges to threshold voltage level, whereupon the resistive-capacitive means begins recharging. Advantageously, the timing network may be established by external capacitive-resistive elements with pulse width variable over several decades of time.

Voltage comparator means compares the voltage charge of the resistive-capacitive means with a reference voltage and develops an output signal when the voltage charge rises above the reference voltage. The comparator includes voltage and temperature compensation means and input voltage clamp means to improve circuit performance and stability.

The invention and objects and features thereof will be more fully understood from the following description and appended claims when taken with the drawings.

BRIEF DESCRIPTION OF THE DRAWINGS

For a more complete understanding of the monostable multivibrator of the present invention, reference may be had to the drawings which are incorporated herein by reference and in which.

DESCRIPTION OF THE PREFERRED EMBODIMENT

State-of-the-art multivibrators are well known in the electronic art. See, for example, "Monostable and Astable Multivibrators," *Pulse, Digital and Switching Waveforms*, Millman & Taub, pp. 404 et seq., McGraw-Hill, 1965. They have been fabricated in integrated-circuit form and have been especially useful for applications such as delayed pulse generation and in synchronized oscillators with constant output pulse width. The Fairchild 9600 part is described in the Fairchild Semiconductor *TTL Data Book*, June 1972, at pp. 7-1 et seq. Applications for such compact multivibrators are set forth in the Fairchild Semiconductor *TTL Applications Handbook*, August 1973, pp. 13-1 et seq.

The monostable multivibrator of the present invention is an improvement over existing monostable multivibrators and the 9600 part described above because it provides a wide delay range, accuracy, stability and prediction accuracy. The wide pulse width may be varied over a three-decade range by variation of the timing resistor. This is advantageous since (1) extremely long timing delay can be obtained by using relatively inexpensive high value timing resistors rather than relatively expensive high value timing capacitors and (2) precise timing delays can be achieved without using expensive trimming resistors.

Figure 1:
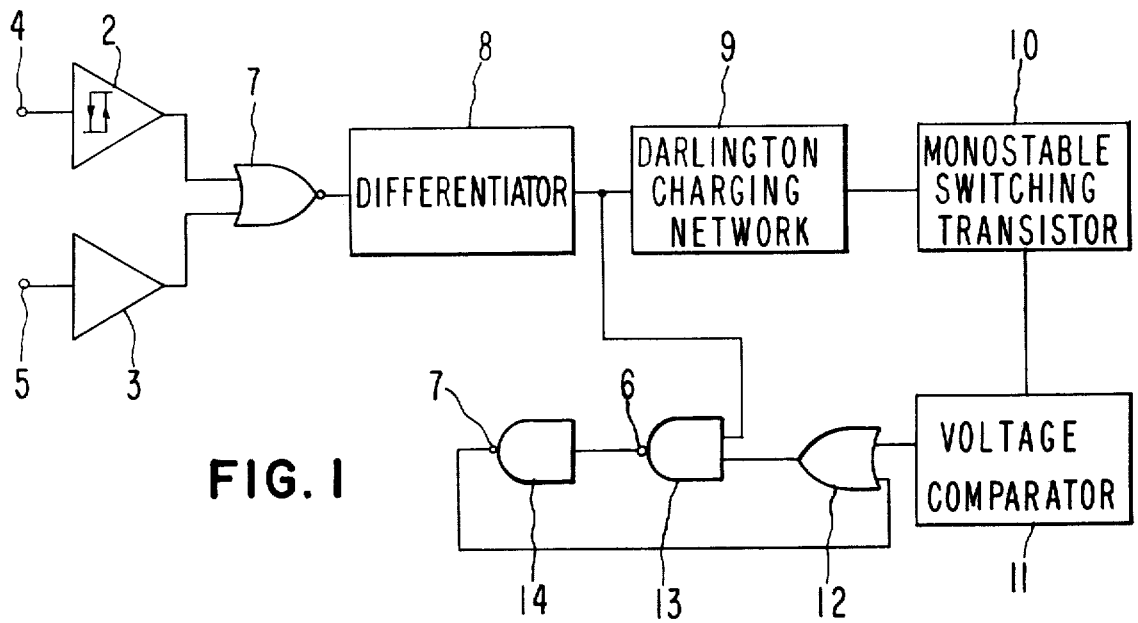
FIG. 1 is a block diagram of the monostable multivibrator of the present invention.
Figure 2A:
FIGS. 2a–2d are timing diagrams illustrating, respectively, the input pulse, monostable switching transistor state, timing impedance charge and output pulse.
Figure 2B:
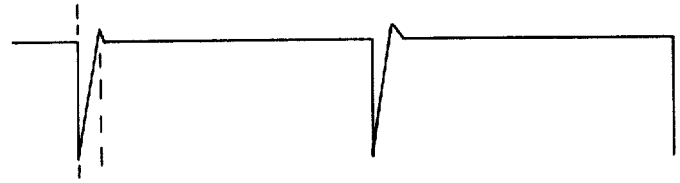
Figure 2C:
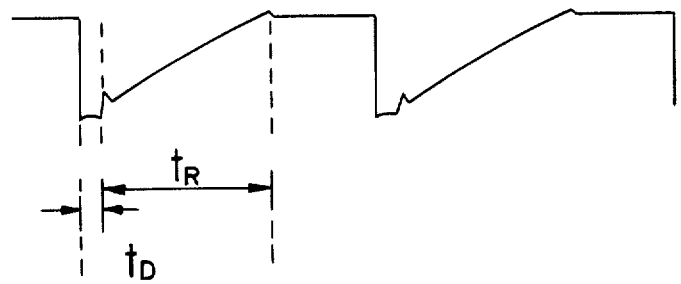
Figure 2D:

Before considering the diagram of the circuit shown in FIG. 1, consider the timing diagrams of FIGS. 2a–2d, where it can be seen that a triggering pulse of one width, as shown in FIG. 2a, can be used to produce an output pulse with another width, as shown in FIG. 2d. This is accomplished by triggering a monostable switching transistor in a monostable multivibrator circuit. The switch-in state of the monostable switching transistor is shown in FIG. 2b. At the time the switching transistor is switched, a timing impedance network is discharged. The charge state of the timing impedance is shown in FIG. 2c. The time that it takes for the timing impedance to be discharged plus the recovery time of the monostable switching transistor determines the width of the output pulse. The value of the timing impedance, as well as the characteristics of the charging means, determines the recovery time. It is therefore highly desirable to have $t_R$, the recovery time of the monostable switching transistor, very large when compared to $T_D$, the discharge time of the timing impedance, so that various values for the components $R_X$ and $C_X$) which constitute the timing impedance may be selected to allow a wide range of output pulse widths. In particular, it is desirable to be able to vary the value of the external timing resistor to control the output pulse width. For monostable multivibrators fabricated in monolithic integrated-circuit form, the characteristics of the discharging network will be process-dependent so that minimization of $t_D$ as compared to $t_R$ will not only permit flexibility and wide range, but also consistency from device to device.

The functional features of the monostable multivibrator of the present invention are shown in the preferred embodiment of FIG. 1. A hysteresis signal is generated in Schmitt trigger 2 in order to provide large noise immunity. The input signal is introduced to terminal 5. The signal passes through inverting amplifier 3 and is introduced along with the output of Schmitt trigger circuit 2 to the inputs of NOR gate 7. The output of NOR gate 7 is introduced to differentiator 8 and to the output circuitry including OR gate 13 as a "lookahead" signal. It should be appreciated that the circuitry preceding differentiator 8 is not required to practice the invention, but this conventional circuitry can provide input signal stability.

The differentiated representation of the input signal provides a trigger pulse which is introduced to Darlington charging network 9. Simultaneously, the monostable switching transistor 14 is turned on and the timing network begins discharging; immediately thereafter the Darlington charging network 9 produces a high current which effectively accelerates the discharge. The voltage drop of the timing network terminates an output signal from voltage comparator 11, and when the voltage in the timing network recharges to a preestablished level, as determined by voltage comparator 11, the output signal is again generated. This output signal is applied to the output circuitry OR gate 12 with the output of gate 12 applied as an input to NAND gate 13. The output 6 of gate 13 is the true or 0 output which is applied through inverter 14 to develop the untrue or $\overline{0}$ output at 7. The $\overline{0}$ output is applied as one input to OR gate 12.

Figure 3:
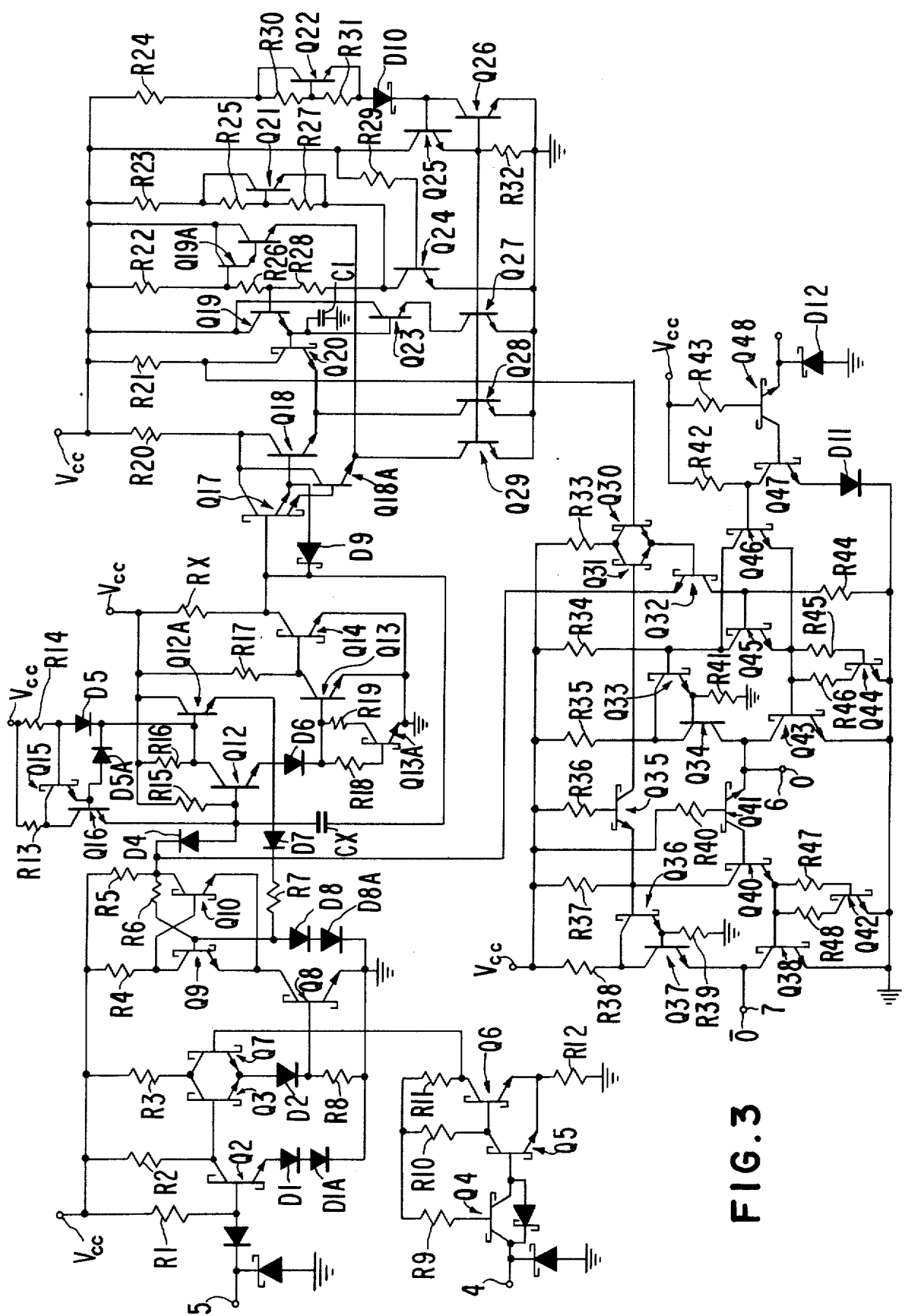
FIG. 3 is a circuit schematic illustrating an embodiment of the monostable multivibrator of the present invention.

A specific embodiment of the circuit of FIG. 1 is shown in the schematic of FIG. 3. The trigger logic is conventional and includes transistor Q2 with its base connected to receive an input signal from terminal 5. The Schmitt trigger circuitry includes transistors Q4, Q5 and Q6 with the input to the Schmitt trigger being applied at terminal 4. The output of the trigger logic taken at the collector of transistor Q2 and the output of the Schmitt trigger taken at the collector of transistor Q6 are applied respectively to transistors Q3 and Q7 of the NOR gate 7 of FIG. 1. The output of NOR gate 7 taken between diode D2 and resistor R8 is applied to the base of trigger transistor Q8 which provides an input to the differentiator circuitry comprising transistors Q9 and Q10. The trigger logic, Schmitt trigger, and differentiator circuitry are conventional.

The differentiator output taken at the collector of transistor Q10 is applied to the base of transistor Q12 which controls the base drive to transistor Q13 of the monostable circuitry comprising transistors Q13, Q14, and the timing circuit including resistor $R_X$ and capacitor $C_X$. A Darlington transistor pair Q15 and Q16 is connected to capacitor $C_X$ to provide fast discharge thereof, as will be described. Transistor Q12A is provided to reset the differentiator flip-flop, as will be described. The output of the monostable circuit taken at the collector of transistor Q14 is applied to the differential comparator which has a voltage and temperature independent threshold.

Before describing the structure and operation of the differential comparator, consider the operation of the monostable circuitry which provides the voltage to the differential comparator to effect the output signal.

In the quiescent state, Q8 is off, the charging monostable and the discharging Darlington transistor pairs are in their stable states (Q13 on, Q14 off, Q15 and Q16 off). To initiate a cycle, transistor Q8 is turned on by an input trigger, and the differentiator flip-flop is set (Q9 is off, Q10 on) when Q8 goes into saturation. When transistor Q10 is turned on, the monostable circuitry (Q13, Q14) is set to its unstable state (Q13 off, Q14 on) by turning Q12 off with current flowing through diode D4. Turning off transistor Q12 allows transistor Q12A to supply base drive to transistor Q9, turning on transistor Q9 and restoring the differentiator flip-flop to its stable state (Q9 on, Q10 off). Thus, the collector of transistor Q10 produces a narrow, negative-going pulse, as shown in FIG. 2b.

When the monostable circuit is triggered (Q13 off, Q14 on), timing capacitor $C_X$ is allowed to discharge into the collector of transistor Q14 with the current supplied by the Darlington circuit (Q15, Q16) through resistor R13, accelerating the discharge. After $C_X$ loses sufficient charge (when transistor Q12 base voltage recovers to $3V_{be}$), the emitter-base junction of Q12 is forward-biased, turning transistor Q13 on; the monostable now returns to its stable state (Q13 on, Q14 off). Capacitor $C_X$ then begins charging toward $V_{CC}$ through resistor $R_X$. Because the R13 resistance of the Darlington circuit is much less than $R_X$, discharge time is only a small percentage of the total timing cycle, with the current provided by the Darlington circuit accelerating the discharge time. When the timing capacitor is recharged to the threshold of the differential comparator, the timing cycle ends.

Consider now the comparator circuit 11 which compares the voltage at the collector of transistor Q14 with a reference voltage and generates an output signal indicative thereof. The comparator circuit includes a first Darlington circuit comprising transistors Q17 and Q18 which receive the output signal from the monostable circuit 10 at the base of transistor Q17, and a second Darlington circuit comprising transistors Q17 and Q18A which supplies input current to clamp the input at approximately threshold level for transistor Q17. A third Darlington pair Q19 and Q20 receives the reference voltage at the base of transistor Q19 whereby current flows through transistor Q18 of the first Darlington pair, or through transistor Q20 of the third Darlington pair, through transistor Q28 to ground depending on the input signal from monostable circuit 10. In the quiescent state the input signal is positive and transistor Q18 is more conductive than transistor Q20. Thus, the comparator output taken at the collector of transistor Q20 is at a high voltage level in the quiescent state.

The current provided by the input Darlington (Q17, Q18) and the output Darlington (Q19, Q20) through transistor Q28 is constant. This constant current is established by the circuit including resistor R24, resistor R30, resistor R31, transistor Q22, diode D10 and transistor Q26. Transistor Q25 is interconnected with transistor Q26 to make the collector current of Q26 equal to the emitter current of Q26. By connecting the base of transistor Q26 to the base of transistors Q27 and Q28, the $V_{be}$ of the transistors are equal and, consequently, the currents through the transistors are related or equal (depending on transistor geometries). Since the constant current source tracks variations in the supply voltage, $V_{CC}$, and tracks temperature, the voltage at the collector of transistor Q20 will be $4V_{be}$, which is independent of $V_{CC}$ and temperature when the resistive-capacitive voltage reaches the threshold of the comparator.

Resistors R23, R25, R27, and transistor Q21 are provided to adjust the current density through transistor Q24 to equal the current density through transistor Q14. Transistor Q24 provides compensating voltage saturation ($V_{SAT}$) characteristics, thereby moving the voltage on the base of transistor Q19.

With the unique circuitry of the voltage comparator, very low input bias current will drive the comparator. In operation, when the transistor Q14 of the monostable circuit 10 becomes conductive in the unstable state, transistor Q18 becomes less conductive and transistor Q20 becomes more conductive, thereby providing a reduced output voltage to the output logic. The logic circuitry is conventional and is not critical to the invention. The NAND gate 12 of the output includes transistor Q30, whose base terminal is connected to receive the output from comparator 11, and transistor Q31. The emitters of transistors Q30 and Q31 are connected to the base of transistor Q32 (OR gate 13) which provides a bias current to transistor Q45. Transistor Q45, in turn, controls transistor Q43 with the 0 output taken at the collector of transistor Q43, as indicated. The 0 output is also applied to the NAND gate 14 comprising transistors Q38 and Q40 with the output of the NAND gate taken at the collector of transistor Q38. The NAND output is reflected through transistors Q37, Q36 and Q35 back to the NAND gate 12 input at the base of transistor Q31.

A CLEAR signal (e.g., 0 volt) can be applied to the gate circuitry at the emitter of transistor Q48 which is transmitted through transistors Q47, Q46 and Q43 to the OR gate 13 output to drive the 0 output low (e.g., 0 volt).

The improved monostable circuitry provided with applicant's invention including accelerated discharge of the monostable timing circuitry and the compensated voltage comparator is characterized by increased stability and accuracy. Further, the timing circuit is easily varied by external resistance to alter pulse width.

In a particular embodiment of the circuit of FIG. 3, NPN Schottky transistors and Schottky clamping diodes were used with resistors having the following values:

TABLE I

| Resistor | Value (ohms) | Resistor | Value (ohms) |
| --- | --- | --- | --- |
| R1 | 6K | R25 | 3K |
| R2 | 4K | R26 | 850 |
| R3 | 1.5K | R27 | 1K |
| R4 | 4K | R28 | 7.3K |
| R5 | 2K | R29 | 10K |
| R6 | 3K | | |
| R7 | 1K | R32 | 1.4K |
| R8 | 2K | R33 | 1.2K |
| R9 | 6K | R34 | 900 |
| R10 | 2.63K | R35 | 55 |
| R11 | 4.5K | R36 | 2.5K |
| R12 | 600 | R37 | 900 |
| R13 | 72 | R38 | 55 |
| R14 | 4K | R39 | 3.6K |
| R15 | 5K | R40 | 2.8K |
| R16 | 2K | R41 | 3.6K |
| R17 | 1K | R42 | 3K |
| R18 | 500 | R43 | 6K |
| R19 | 250 | R44 | 3.5K |
| R20 | 4K | R45 | 350 |
| R21 | 4K | R46 | 250 |
| R22 | 9K | R47 | 350 |
| R23 | 720 | R48 | 250 |

TABLE I-continued

| Resistor | Value (ohms) | Resistor | Value (ohms) |
| --- | --- | --- | --- |
| R24 | 4K | | |

While the invention has been described with reference to a specific embodiment, the description is illustrative and is not to be construed as limiting the invention. Various changes and modifications may occur to those skilled in the art without departing from the true spirit and scope of the invention as defined by the appended claims.

I claim:

1. A monostable multivibrator with improved timing control comprising:
    a. a pair of transistors interconnected whereby one transistor is conductive when the other transistor is nonconductive and wherein said transistors have a stable state and an unstable state,
    b. resistive-capacitive means interconnected with said pair of transistors for establishing the time period of said unstable state,
    c. means operably connected with said transistors for triggering said pair of transistors to said unstable state and effecting a discharge of said resistive-capacitive means, said pair of transistors reverting to said stable state when said resistive-capacitive means discharges to an established voltage level whereupon said resistive-capacitive means begins recharging,
    d. voltage comparator means operably connected to said resistive-capacitive means for comparing the voltage charge of said resistive-capacitive means with a reference voltage and developing an output signal responsive to said comparison, and
    e. means operably connected to said resistive-capacitive means for accelerating the discharge of said resistive-capacitive means whereby the recharge time period is much longer than the discharge time period, including a Darlington circuit interconnected with said means for triggering and said resistive-capacitive means whereby said resistive-capacitive means discharges through said Darlington circuit.

2. A monostable multivibrator with improved timing control comprising:
    a. a pair of transistors interconnected whereby one transistor is conductive when the other transistor is nonconductive and wherein said transistors have a stable state and an unstable state,
    b. resistive-capacitive means interconnected with said pair of transistors for establishing the time period of said unstable state,
    c. means operably connected with said transistors for triggering said pair of transistors to said unstable state and effecting a discharge of said resistive-capacitive means, said pair of transistors reverting to said stable state when said resistive-capacitive means discharges to an established voltage level whereupon said resistive-capacitive means begins recharging,
    d. voltage comparator means operably connected to said resistive-capacitive means for comparing the voltage charge of said resistive-capacitive means with a reference voltage and developing an output signal responsive to said comparison, e. means operably connected to said resistive-capacitive means for accelerating the discharge of said resistive-capacitive means whereby the recharge time period is much longer than the discharge time period, and, f. output gate means operatively connected with said means for triggering whereby an output pulse is generated in response to a trigger signal, said output gate means operatively connected with said voltage comparator means for terminating said output pulse in response to an output signal from said voltage comparator means.

3. A monostable multivibrator as defined by claim 2 wherein said voltage comparator means includes a first Darlington circuit connected to receive a control signal from said resistive-capacitive means, a second Darlington circuit connected to receive a control signal from a reference voltage, and an output terminal connected to said second Darlington circuit whereby a voltage at a first level is present at said output terminal when said transistor pair is in the stable state and a voltage at a second level is present after said transistor pair switches to the unstable state and before said resistive-capacitive means recharges to a threshold voltage for said comparator.

4. A monostable multivibrator as defined by claim 3 wherein said first Darlington circuit and said second Darlington circuit are interconnected whereby said first Darlington circuit is normally more conductive than said second Darlington circuit except during the discharge and recharging of said resistive-capacitive means to said reference voltage level.

5. A monostable multivibrator circuit as defined by claim 4 wherein said voltage comparator means includes constant current means and compensating voltage saturation means whereby said reference voltage tracks variations in supply voltage and temperature and whereby the voltage level at said output terminal is $4V_{be}$, where $V_{be}$ is the base emitter voltage of a conductive transistor, when the resistive-capacitive means voltage reaches threshold level of said comparator.

6. A monostable multivibrator circuit as defined by claim 5 wherein said first Darlington circuit and said second Darlington circuit are interconnected through a common transistor with said constant current means establishing a fixed base-emitter voltage of said common transistor whereby current from said first Darlington circuit and said second Darlington circuit through said common transistor is constant.

* * * * *